United States Patent [19]

Perrigo

[11] Patent Number: 4,524,845

[45] Date of Patent: Jun. 25, 1985

[54] LOW FREQUENCY SPEAKER ENCLOSURE

[76] Inventor: Stephen M. Perrigo, 14321 SE. 187th Ave., Clackumas, Oreg. 97015

[21] Appl. No.: 470,792

[22] Filed: Feb. 28, 1983

[51] Int. Cl.$^3$ .................... H05K 5/00

[52] U.S. Cl. .................... 181/152; 181/159

[58] Field of Search .................... 181/144, 145, 152, 159, 181/146, 182, 183, 187, 192, 160, 194, DIG. 1, 151, 189

[56] References Cited

U.S. PATENT DOCUMENTS

| | | | |
|---|---|---|---|
| 2,975,852 | 3/1961 | Chave | 181/155 |
| 3,443,660 | 5/1969 | Virca et al. | 181/31 |
| 3,867,996 | 2/1975 | Lou | 181/148 |
| 3,909,531 | 9/1975 | Plummer | 179/1 E |
| 3,962,544 | 6/1976 | Kobayashi | 179/1 E |
| 4,057,689 | 11/1977 | Stallings, Jr. | 179/1 E |
| 4,213,008 | 7/1980 | Helffrich | 179/1 E |
| 4,213,515 | 7/1980 | Laupman | 181/145 |
| 4,325,454 | 4/1982 | Humprey | 181/145 |

*Primary Examiner*—L. T. Hix

*Assistant Examiner*—Brian W. Brown

*Attorney, Agent, or Firm*—William H. Wright

[57] ABSTRACT

This invention relates to low-frequency speaker enclosures in general, and more specifically to a dual cabinet construction, wherein each of the cabinet structures contains a portion of a generally semi-circular uniform diameter horn passageway, formed by contoured foam elements that provide redirection and amplification of rear-cone sound wave energy, through the forward face of the combined cabinet construction.

4 Claims, 4 Drawing Figures

FIG. 1
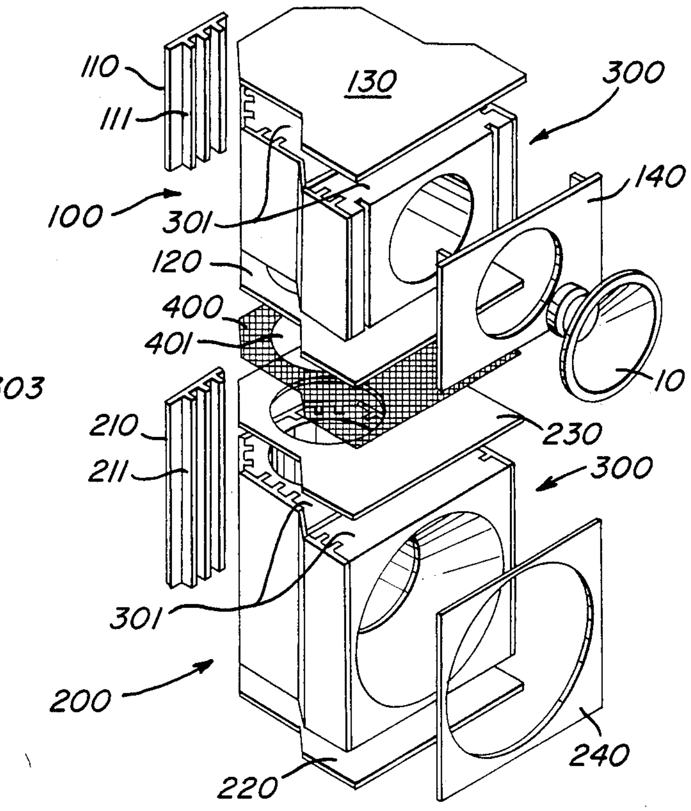
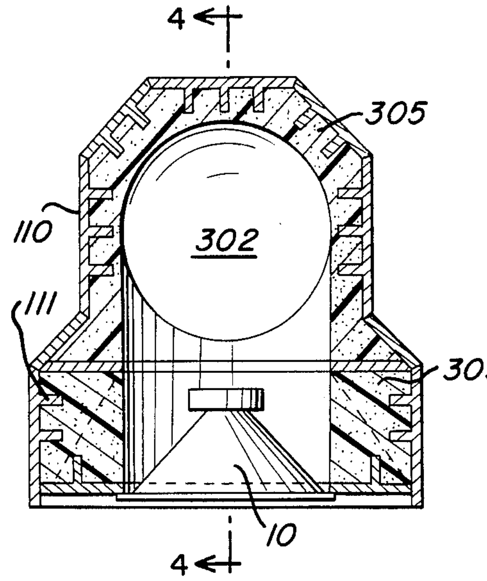
FIG. 2
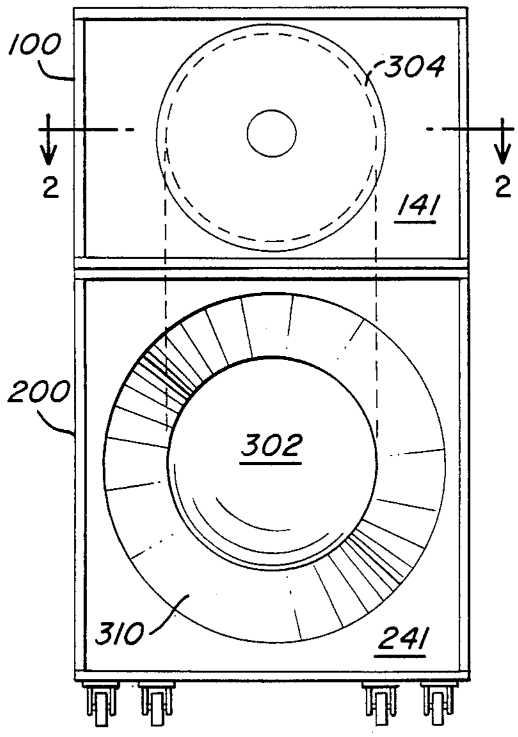
FIG. 3
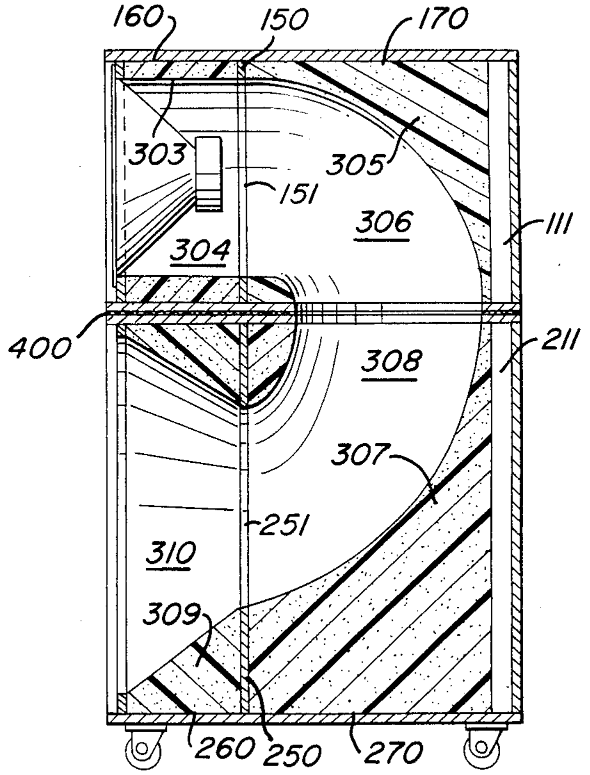
FIG. 4

LOW FREQUENCY SPEAKER ENCLOSURE

BACKGROUND OF THE INVENTION

The prior art is replete with speaker enclosure constructions, which are designed to alter the direction of rear-cone sound waves emminating form the speaker element, as can be seen by reference to the following patents:

U.S. Pat. No. 3,962,544—discloses a dual speaker enclosure, which is designed to direct rear-cone radiation out the sides of the enclosure, to improve radiation efficiency and transient response.

U.S. Pat. No. 3,909,531—provides a rectangular cavity for the midrange speaker, with a forward facing enclosure opening, that houses the tweeter speaker.

U.S. Pat. No. 4,213,008—discloses an interior reardwardly facing horn, which directs the rear-cone sound downwardly and rearwardly through an expanding horn opening. This horn body is formed by the exterior walls of the cabinet and large rectangular slats.

U.S. Pat. No. 4,325,454—discloses a speaker system that inverts and redirects the speaker backwave out of the cabinet, by directing the sound wave against a slant board and thence through an enlarged triangular opening.

U.S. Pat. No. 4,213,515—discloses a speaker enclosure, which has at least one passageway leading from the interior of the enclosure, to the front and rear of this passageway to be one and one half times larger than the central section of the passageway. In addition, the interior cavity, that forms part of the passageway from the rear of the speaker to the face of the cabinet, is provided with sharp edges on opposing wall surfaces, that will have a deleterious effect on the sound waves emminating from the rear of the speaker.

While all of the aforementioned prior art devices have the same ultimate goal (i.e.—the redirection of rear-cone sound waves) their results have been as diverse as their proposed solutions to the problem.

The present invention accomplishes this end, with minimum distortion, maximum amplification, and a strong sound wave dispersion at the outlet of the horn.

SUMMARY OF THE INVENTION

An object of the present invention is to provide a low frequency speaker enclosure, that will redirect rear-cone sound waves to the front of the enclosure with minimum sound wave distortion.

Another object of the present invention is to provide an internal enclosure construction, that will form a horn for amplifying and directing low frewency sound waves, from the front of the enclosure cabinet.

Still another object of the present invention is to provide a sectional internal enclosure construction, that will provide support for the exterior walls of the enclosure, in addition to providing a smooth circular internal passageway for sound waves.

A further object of the present invention is to provide an enclosure construction, wherein the interior element occupies all of the cabinet space, with the exception of a curved sound transmitting passageway.

Yet another object of the present invention is the provision of a low frequency speaker interior enclosure construction, to produce phase inversion, as opposed to using inner cabinet baffling and cabinet walls, to amplify the sound pressure levels and tonal qualties of the speaker element.

A yet further object of the present invention is to provide an internal horm within a speaker enclosure, that produces very little sound wave energy loss, due to sound wave reflection from angular surfaces found in the prior art horn construction.

Another object of the present invention is the provision of a horn forming enclosure, which isolates the cabinet walls from the sound wave energy.

These and other objects, advantages and novel features of the invention will become apparent from the detailed description that follows, when considered in conjunction with the accompanying drawings.

BRIEF DESCRIPTION OF THE DRAWINGS

FIG. 1, is an exploded perspective view of the segmented enclosure interior and associated cabinet structure for the low frequency speaker.

FIG. 2, is a top cross-sectional view of the upper segment of the speaker enclosure.

FIG. 3, is a front elevation view of the speaker enclosure.

FIG. 4, is a side cross-sectional view of the enclosure, showing the horn configuration with respect to the individual segments.

DETAILED DESCRIPTION OF THE PREFERRED EMBODIMENT

The low frequency speaker enclosure, which forms the basis of the present invention, comprises in general; a speaker element 10; and upper 100 and lower 200 cabinet structure; and an internal enclosure member 300.

The upper cabinet structure 100 comprises a plurality of side panels 110, an apertured bottom panel 120, a top panel 130 and an apertured face panel 140, which forms an upper cabinet external enclosure.

The lower cabinet structure 200 comprises a plurality of side panels 210, a bottom panel 220, an apertured top panel 230 and an apertured face panel 240, which form a lower cabinet external enclosure.

While the upper and lower cabinet structure as illustrated FIGS. 1 and 2 are contoured, it is to be understood that the external configuration of the cabinet structures do not form a part of this invention, and any aesthetically pleasing geometric or non-geometric cabinet configuration may be employed. All of the panels likewise may be fabricated from wood, chipboard, plastic or other suitable rigid material.

As best can be seen by reference to FIGS. 1 thru 3, the side panels 110 and 210 are further provided with stiffening ribs 111 and 211 respectively, which are intended to provide rigidity and support to the cabinet structures. In addition, both the cabinet structures are provided with apertured internal partition members 150 and 250 respectively, which divide the interiors of the upper and lower cabinet structures into front 160, 260 and rear 170, 270 compartments. The partition members 150, 250 are also intended to give support to the cabinet structures; however, they also serve another purpose which will be described in detail further on in the specification.

The internal enclosure member 300 forms the heart of this invention and comprises contoured foam members 301, preferably formed from polyurethane foam, which is configured by molds, to form a generally semi-circular tubehorn passageway 302, through all of the compartments in the combined cabinet structures. While polyurethane foam is used in the preferred embodiment, other suitable moldable sound insulating materials would be equally acceptable.

As can best be seen by reference to FIG. 4, the upper front cabinet compartment 160 is provided with a molded foam element 303, having a slightly tapered conical opening 304, whose smaller diameter coincides with the aperture 151 in the upper partition 150. The upper rear cabinet compartment 170 is provided with a molded foam element 305, having a curved generally constant diameter passageway 306, whose opening coincides with openings in the apertured top 230 and bottom 120 panels mentioned supra.

The lower rear cabinet compartment is provided with a molded foam element 307, having a generally constant diameter passageway 308, whose openings coincide with the openings in the apertured top and bottom panels and the aperture 251, in the lower partition 250. The lower front cabinet compartment is provided with a molded foam element 309 having a sharply tapered conical opening 310, whose smaller diameter opening coincides with the aperture 251 in the lower partition.

Each one of the molded foam elements 303,305,307 and 309 is configured, so that the molds used to form the elements can easily be removed from the respective cabinet structures, once the polyurethane foam has cured, and prior to connection of the upper and lower cabinet structures together.

While it would be possible to create the tube horn passageway 302, by other means, trial and error has proven that the sectional approach to molding the polyurethane foam is not only the most practical method, but would also lend itself readily to the mass production of the interior enclosure 300.

Once the foam has cured, the low-frequency speaker is mounted in the forward portion of the aperture 304, and then the upper face panel 140, which forms a speaker baffle 141, is secured thereto, to complete the assembly of the upper cabinet enclosure 100. The lower face panel 240, which forms the tube horn baffle 241, is then secured to the forward portion of the aperture 310, to complete the assembly of the lower cabinet enclosure 200.

Prior to assembling the upper and lower cabinet structures together to form the low-frequency speaker enclosure, an apertured resilient sealing element 400, preferably in the form of a rubber mat 401, is interposed between the respective cabinet structures to damp any vibration therebetween. Suitable securing means (not shown) are provided to secure the cabinet structures together to complete the assembly.

It should be appreciated at this point that a low-frequency speaker assembly built in accordance with the above teachings, will re-direct the rear-cone sound waves from the speaker along a smooth surfaced generally constant diameter tube horn. The sound waves will experience minimum distortion, maximum amplification, and will project a long strong sound wave dispersion as they leave the forward end of the lower cabinet structure.

In addition, the foam 301 that forms the tube horn passageway 302, not only will isolate the sound waves from the exterior cabinet structures, thereby eliminating inner cabinet reflections from baffles that conventional enclosures experience; but will also eliminate the need for inner cabinet bracing, since the lightweight foam becomes essentially an integral part of the inner cabinet structure and reduces the overall weight of the finished product. Furthermore, the tube horn passageway produces a high sound pressure level, which is required by bands during on-stage performances, where a long sound projecting dispersion is necessary.

As mentioned supra, the partition elements 150, and 250 serve an additional function in that they segregate the various conpartments during the molding operation. The partitions therefore permit the compartments of each cabinet section to be filled with uncured foam. After the foam has been cured, the individual mold forms can be removed from the respective compartments with ease.

Having thereby disclosed the subject matter of this invention, it should be obvious that many substitutions, modifications, and variations of the invention are possible in light of the above teachings. It is therefore to be understood that the invention as taught and described is only to be limited to the extent of the breadth and scope of the appended claims.

What I claim is:

1. An improved low frequency speaker enclosure comprising:

an upper cabinet structure divided by partitions into upper front and rear compartments wherein each of the upper compartments are provided with a contoured molded foam element; and the contoured molded foam element in the upper rear compartment foams a portion of a generally semi-circular, generally constant diameter, tube horn passageway; and the contoured molded foam element in the upper front compartment forms an opening, having one end that coincides with the generally constant diameter of said tube horn passageway, and whose other end is dimensioned to accommodate a low frequency speaker; and a lower cabinet structure connected to the upper cabinet structure, wherein the lower cabinet structure is also divided by partitions into lower front and rear compartments, wherein each of the lower compartments are provided with a contoured molded foam element; and the contoured molded foam element in the lower rear compartment forms the remaining portion of the said generally semi-circular, generally constant diameter, tube horn passageway; and, the contoured molded foam element in the lower front compartment forms a sharply tapered conical opening, whose one end coincides with the said generally constant diameter of the tube horn passageway, and whose other end forms the mouth of the tube horn passageway.

2. An improved low frequency speaker enclosure as in claim 1; wherein, the generally semi-circular tube horn passageway is disposed to receive rear cone sound waves of the low frequency speaker and redirect said waves through the front compartment of the lower cabinet structure.

3. An improved low frequency speaker enclosure as in claim 2; wherein, the contoured molded foam elements are fabricated from sound insulating foam.

4. An improved low frequency speaker enclosure as in claim 3, wherein the said sound insulating foam is polyurethane.

* * * * *